United States Patent [19]

Houston et al.

[11] Patent Number: 4,980,860

[45] Date of Patent: Dec. 25, 1990

[54] CROSS-COUPLED COMPLEMENTARY BIT LINES FOR A SEMICONDUCTOR MEMORY WITH PULL-UP CIRCUITRY

[75] Inventors: Theodore W. Houston, Richardson; Patrick W. Bosshart, Dallas, both of Tex.

[73] Assignee: Texas Instruments Incorporated, Dallas, Tex.

[21] Appl. No.: 521,000

[22] Filed: May 8, 1990

Related U.S. Application Data

[63] Continuation of Ser. No. 879,654, Jun. 27, 1986, abandoned.

[51] Int. Cl.[5] .................... G11C 5/06; G11C 7/02; G11C 11/40
[52] U.S. Cl. ................... 365/189.11; 365/51; 365/63; 365/69; 365/206
[58] Field of Search ............ 365/182, 189.11, 205, 365/206, 207, 208, 51, 63, 69

[56] References Cited

U.S. PATENT DOCUMENTS

| | | | |
|---|---|---|---|
| 3,303,481 | 2/1967 | Kessler | 365/69 |
| 3,942,164 | 3/1976 | Dunn | 365/207 X |
| 4,238,838 | 12/1980 | Wright et al. | 365/69 |
| 4,476,547 | 10/1984 | Miyasaka | 365/205 |
| 4,493,057 | 1/1985 | McElroy | 365/51 X |
| 4,570,241 | 2/1986 | Arzubi | 365/205 |
| 4,602,355 | 7/1986 | Watanabe | 365/206 |
| 4,694,428 | 9/1987 | Matsumura et al. | 365/189 |
| 4,733,374 | 3/1988 | Furuyuma et al. | 365/205 |

FOREIGN PATENT DOCUMENTS 0167281 1/1986 European Pat. Off. .
60-254489 12/1985 Japan .

Primary Examiner—Alyssa H. Bowler
Attorney, Agent, or Firm—James C. Kesterson; James T. Comfort; Melvin Sharp

[57] ABSTRACT

A criss-crossed complementary bit line and cross-coupled pull-up means is disclosed. One bit line (26) is crossed with respect to another bit line (28) of a complementary bit line pair to reduce the effect of noise interference induced therein. P-channel cross-coupled pull-up transistors (154, 156) are connected between the bit lines (26, 28) at an intersection (148) to assure that when one bit line is pulled low by the readout of a memory cell (158), the other bit line is pulled to the supply voltage.

12 Claims, 2 Drawing Sheets

CROSS-COUPLED COMPLEMENTARY BIT LINES FOR A SEMICONDUCTOR MEMORY WITH PULL-UP CIRCUITRY

This application is a continuation of application Ser. No. 879,654 filed June 27, 1986 now abandoned.

TECHNICAL FIELD OF THE INVENTION

The present invention relates in general to semiconductor memories, and more particularly relates to a method and structure for reducing noise interference in memories of the type utilizing complementary bit lines.

BACKGROUND OF THE INVENTION

There is a continued effort to develop semiconductor memories which are less susceptible to both externally and internally generated noise signals. As the cell size of each generation of memory becomes smaller, the voltages representative of the stored digital ones or zeros also become smaller. Hence, the presence of any noise signal coupled into the low level signal lines of a memory can adversely affect the reliability of the memory.

In the well-known core memories employing toroidal magnetic cores as the memory element wherein wires carry the small data signals, electromagnetic interference was reduced by twisting the pairs of bit line wires carrying the incoming and outgoing currents to the magnetic core assembly. In this manner, undesired electrical signals were induced into both wires of the bit line by the same magnitude. With the same amplitude of a noise signal induced into both such wires, a differential-type sense amplifier could easily detect the small analog signal generated when the magnetic core switched states, even when accompanied by the common mode noise.

With the current almost exclusive use of semiconductor memories, the problem presented by induced noise signals is not so easily solved. The problem is even more exacerbated in semiconductor memories where the metal or polysilicon conductor lines are only on the order of a few microns apart. Where such closely adjacent lines carry, for example, five volt logic signals, such signals can be capacitively coupled to other signal lines, such as the bit lines of the memory. Semiconductor memory sense amplifiers have become very sophisticated in attempts to provide a high rejection to noise signals on the bit lines, while at the same time being highly sensitive to memory readout signals.

In a microprocessor chip having bidirectional data and address buses coupled to other circuits on the chip, the possibility of noise interference with the microprocessor memory, which is also located on the chip, increases. In recent microprocessor designs, it is advantageous to fabricate the memory at a subsurface level, with the data or address lines overlying the memory. This is advantageous both from the standpoint of coupling the data bit lines to the memory input, as well as coupling the memory output back to the data lines. Space is also economized. This type of architecture presents a classical opportunity for the inducement of undesired electrical signals from the data or address lines into the bit lines of the memory.

The noise interference problem is compounded in memory designs employing a complementary bit line architecture. In this type of memory, two low level signal bit lines are required per cell for writing data therein, as well as for reading data out of the cell. A high level logic signal transition on an overlying conductor, or on a conductor adjacent the complementary bit lines, can be capacitively coupled in disproportionate amounts into the bit lines. In this event, the differential sense amplifier may be unable to distinguish between induced noise and a valid logic signal read from the memory cell.

It can be seen from the foregoing that a need exists for an improved semiconductor memory structure which reduces the susceptibility of induced noise signals into the memory bit lines. There is an associated need for a complementary bit line structure which reduces the effects of noise signals induced into the bit lines.

SUMMARY OF THE INVENTION

In accordance with the present invention, a complementary bit line memory structure is disclosed which substantially reduces or eliminates the shortcomings associated with the corresponding prior art circuits. In accordance with the memory structure of the invention, the metal or polysilicon conductive complementary bit lines are criss-crossed at those locations in which inducement of undesired signals is probable. In split or segmented memory designs, it is preferable, for purposes of electrical balance, to cross the complementary bit lines at a point between the memory cell sections. When crossed, the complementary bit lines are each subjected to the same noise potential, thereby reducing the differential level of any undesired noise signal in the bit line pair.

The crossing of the complementary bit lines is achieved by forming cross-over members as first level polysilicon conductive lines. The elongate bit lines are fabricated as second level, or overlying metal conductors, insulated from the polysilicon members by silicon dioxide. Contacts are formed through the silicon dioxide for connecting the polysilicon members to the appropriate ends of the metal bit lines to provide crossed bit lines.

An additional technical advantage of the invention comprises cross-coupled bit line pull-up means operating in conjunction with the crossed bit lines. One bit line drives a P-channel transistor which is operable to pull the other bit line to a logic high. The other bit line is comparably connected through a P-channel transistor to pull up the one bit line. This provides positive voltage feedback to a memory cell readout operation such that when the reading of the memory cell causes one bit line to be driven a little less positive, the other bit line is automatically pulled up by the pull-up means. This positive feedback accentuates the differential readout of the cell. Any undesired negative voltage induced into both bit lines of the crossed complementary pair is also suppressed by being returned to a high voltage by the cross-coupled pull-up transistors.

Additional noise immunity is provided to the memory cell by utilizing N-channel transistors in series with the bit lines, in the column or word line select part of the memory. With the use of N-channel transistors as column select devices in the bit lines, noise signals of amplitudes less than the threshold voltage of the N-channel transistors cannot be interpreted as valid signals read out of the memory.

BRIEF DESCRIPTION OF THE DRAWINGS

Further features and advantages will become apparent from the following and more particular description of the preferred embodiment of the invention, as illustrated in the accompanying drawings in which like reference characters refer to the same elements throughout the views, and in which.

DETAILED DESCRIPTION OF THE INVENTION

Figure 1:
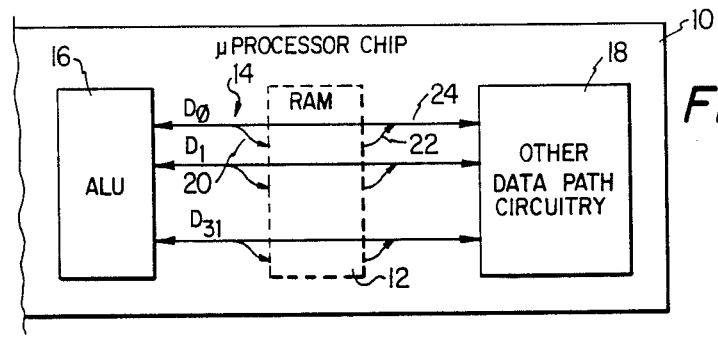
FIG. 1 is a block diagram illustrating a microprocessor application in which the present invention may be advantageously practiced.

The principles and concepts of the present invention are best understood by referring first to FIG. 1 of the drawings, where there is shown an application in which the invention may be advantageously practiced. A microprocessor circuit 10, integrated into a single silicon chip, employs a random access memory 12 coupled to a data bus 14 which is shared by many other circuits of the microprocessor 10. The memory 12 is shown in phantom, formed in the integrated circuit below a number of conductors forming the data bus 14. The data bus 14 is shown as a thirty-two bit bus which is typical of current microprocessor designs.

For purposes of example, an arithmetic logic unit (ALU) 16 is coupled to the memory 12, as well as to other data path circuits 18. The memory is shown as a random access type having an input 20, and an output 22, both associated with conductor 24 of the data bus 14. Data bus 14 can be of the conventional bidirectional type of bus to which many other circuits of the microprocessor 10 are connected.

The conductors of the data bus 14 carry high-speed logic signals which have rising and falling transitions of only a few nanoseconds. With such sharp rise and fall times of the electrical signals, interference can be easily coupled to adjacent circuitry, such as the underlying memory 12. The problem is compounded when the entire structure is formed in a single integrated circuit, as parasitic capacitances can exist between the conductors of the data bus 14 and adjacent circuits integrated into the chip 10.

Figure 2:
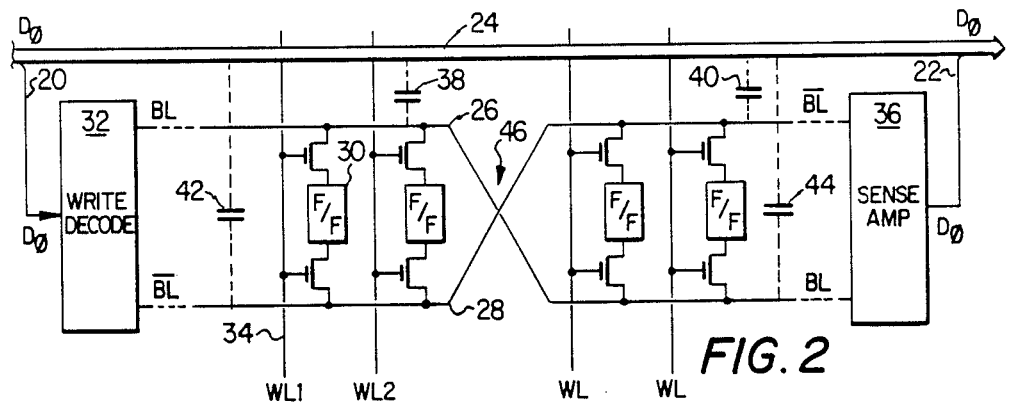
FIG. 2 is a circuit drawing of an exemplary memory structure, illustrating the crossing of a complementary bit line pair.

FIG. 2 illustrates conductor 24 ($D_0$) of the data bus 14 and a portion of the memory 12 associated with the data bus conductors 20 and 22. Specifically shown is a complementary bit line including bit line 26 (BL) and its complement 28 ($\overline{BL}$). It should be understood that a memory typically includes many more complementary bit lines than shown. Bit lines 26 and 28 carry signals written into the memory cells, one cell shown as reference character 30, by the Write decode circuitry 32. The memory cells 30 can be written by the clocking of Word Line 34. Other cells associated with the bit lines are accessed by other similar word lines. Data present on the bit lines 26 and 28 is then stored in a selected cell 30 of the memory. Memories are generally provided with a large number of word lines 34 for accessing one of a number of cells 30 connected to the bit line pair 26 and 28. The write decode circuitry 32 is operative to decode a memory address to place the data present on conductor 24 of data bus 14 on the selected complementary bit line 26 and 28. At the intersection of the word line 34 and the bit line pair 26 and 28, data may be written into a particular memory cell 30.

The memory cell 30 is read by again activating the Word Line 34, whereupon a differential voltage is placed on bit lines 26 and 28. The voltage difference is on the order of five volts and is detected by a sense amplifier 36. When the sense amplifier transistor 36 senses a voltage difference of about a threshold voltage between bit lines 26 and 28, a logic high is placed on the output conductor 22. On the other hand, when an opposite voltage difference is sensed between bit lines 26 and 28, a logic low is placed on the output conductor 22. It is important to realize that the sense amplifier 36 starts to detect either a one or a zero when the voltage difference on the bit lines is a fraction of the full voltage swing. Thus, in order to provide a reliable readout of the memory, electrical noise interference should be kept at a minimum. It is also important to understand that in accordance with the shared bus structure of microprocessors, it is common for the data bus 14 to be actively carrying high level data signals while the memory cells 30 are being read. As a result, the signals on the data bus 14 can be capacitively coupled as noise interference to the bit lines of the memory 12.

FIG. 2 illustrates the parasitic capacitances 38 and 40 between the data bus conductor 24 and the bit lines 26 and 28. Parasitic capacitances 42 and 44 are also shown connected between the data bus conductor 24 and the bit lines 26 and 28. According to an important feature of the invention, the bit lines 26 and 28 of the complementary pair are crossed so that a section of bit line 26 is adjacent data bus conductor 24, and a section of bit line 28 is also adjacent conductor 24. The bit lines 26 and 28 cross without physical contact at point 46. With a crossed bit line arrangement, undesired signals coupled by parasitic capacitor 38 into the upper bit line section 26 are generally of the same magnitude as the undesired signals coupled by parasitic capacitor 40 into the upper section of bit line 28.

In a similar manner, parasitic capacitors 42 and 44 couple substantially the same magnitude of voltages in respective lower sections of bit lines 26 and 28. The undesired voltages induced into the bit lines 26 and 28 may vary, depending upon the value of the parasitic capacitances 38–44, which values cannot be easily controlled. The crossed bit lines 26 and 28 force the undesired signals to be induced into both bit lines 26 and 28 so as to reduce the differential effect thereof. The crossed bit lines advantageously increases the noise margin of those types of memories employing complementary bit lines and sense amplifiers 36 of the type shown.

Figure 3:
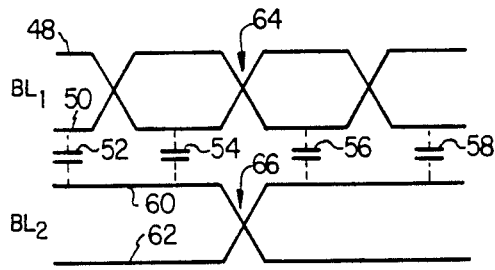
FIG. 3 illustrates another technique for crossing alternate rows of complementary bit lines with different patterns.
Figure 4:
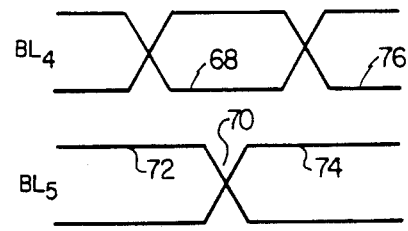
FIG. 4 illustrates yet another pattern of crossing alternate rows of complementary bit lines.

Shown in FIGS. 3 and 4 in simplified form are additional arrangements for crossing complementary bit lines to reduce the effect of undesired signals induced therein. Two adjacent bit lines ($BL_1$, $BL_2$) are shown in FIG. 3 as adjacent bit lines formed in a semiconductor chip. It can be appreciated that insofar as parasitic capacitances exist between the various adjacent bit lines, the possibility of undesired voltages being induced therebetween is present. In the embodiment of FIG. 3, capacitors 52–58 represent parasitic capacitances connected between the bit line pairs of $BL_1$ and $BL_2$.

It can be seen that $BL_1$ includes double the number of crossings as does $BL_2$. As a result, any signal in bit line conductor 50 of $BL_1$ is induced into both the crossed bit lines 60 and 62 of $BL_2$. In like manner, any signal carried by bit line conductor 48 of $BL_1$ is also induced into the crossed bit lines 60 and 62 of $BL_2$. The effect of providing twice the bit line crossings in $BL_1$, as compared to $BL_2$, is that the noise coupled between the bit line pairs $BL_1$ and $BL_2$ is balanced out so that the resulting differential voltage existing in the individual pairs 48, 50 and 60, 62 is reduced substantially to zero. In other words, if a positive voltage is induced by bit line 48 into bit line 60, and a corresponding positive voltage is induced by bit line 48 into bit line 62, the differential voltage induced between bit lines 60 and 62 is zero. The crossed bit line arrangement produces a similar result in bit lines 60 and 62 with regard to voltages induced by bit line 50. In a corresponding manner, voltages induced by bit lines 60 and 62 into bit lines 48 and 50 result in net zero induced voltages. Thus, with common mode noise voltages existing on both bit lines of a pair, such signals will be transparent to many bit line sensing circuits.

The crossing pattern with which the bit lines $BL_1$ and $BL_2$ are constructed are symmetrical in that the crossover locations or points 64 and 66 are laterally adjacent. This may be advantageous in the integrated circuit fabrication thereof where it is desired to connect circuitry, such as bit line bias or pull-up circuitry to both pairs of the bit lines. The bias or pull-up common circuitry may be fabricated by forming polysilicon or other conductive material overlying the crossover points 64 and 66, and connecting the circuitry to the crossed bit lines 48, 50 and 60, 62 lying directly therebelow. It, should be understood that in the embodiment of FIG. 3, the pattern as noted with $BL_1$ would be repeated alternately with the odd-numbered bit lines. In like manner, the crossing pattern as illustrated with $BL_2$ would be repeated with the even-numbered bit lines.

The crossover pattern illustrated in FIG. 4 may be employed in complementary bit line memories where no crossover symmetry is required. For example, a linear section of bit line 68 of complementary pair $BL_4$ is fabricated so as to be adjacent crossover 70 of $BL_5$. As a result, signal voltages present in bit line 68 are induced into both bit lines 72 and 74 of complementary pair $BL_5$. In like manner, voltages on the other bit line 76 of complementary pair $BL_4$ can be induced into those sections of both bit lines 72 and 74 of $BL_5$ which cross near crossing point 72. As noted above, there are no common or symmetrical crossover points between the bit line pairs of the arrangement shown in FIG. 4, but there is yet a net reduction in differential voltages induced in each bit line $BL_4$ and $BL_5$. Also, the fabrication of such an arrangement is simplified as there are fewer crossovers than the embodiment shown in FIG. 3. Many other crossover patterns may be devised by those skilled in the art.

Figure 5:
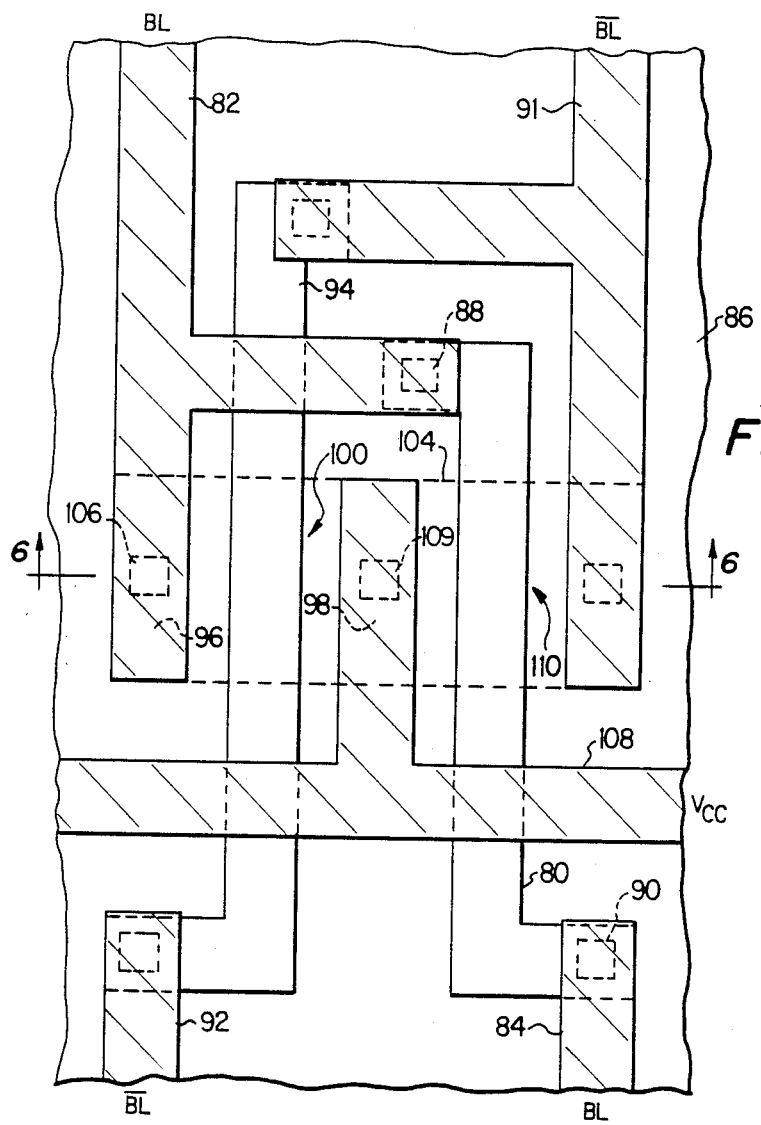
FIG. 5 illustrates a semiconductor structure effective for crossing complementary bit lines.
Figure 6:
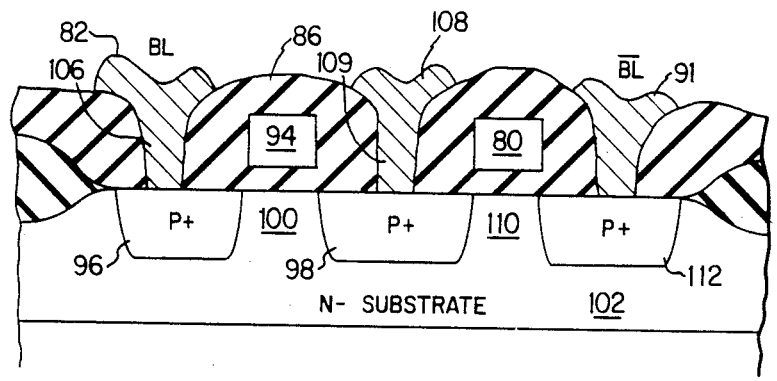
FIG. 6 is a sectional view of the semiconductor structure of FIG. 5, taken along Line 6—6 thereof.

In FIGS. 5 and 6 there are shown respective top and sectional views of a portion of an integrated memory circuit, illustrating the fabrication of a crossover point for complementary bit lines. Bit line crossover member 80 may be conventionally formed with polysilicon to provide a conductor for carrying signals between section 82 and section 84 of bit line BL. Bit line sections 82 and 84 are constructed of metal insulated from the polysilicon crossover member 80 by a silicon dioxide insulating layer 86. Electrical contacts 88 and 90 are formed through the silicon dioxide 86 and complete a electrical path from the metal bit line section 82 to the polysilicon crossover member 80, and from the crossover member 80 to the other metal bit line section 84.

Bit line sections 91 and 92 forming bit line BL are also formed with metal separated by an oxide insulating layer from the underlying polysilicon crossover member 94. It is important to note that in forming the bit line crossover 80, there is no electrical connection between bit line BL and its complement BL.

In accordance with another technical feature of the invention, a cross-coupled transistor pull-up is provided at the intersection of the crossed bit lines BL and BL. The fabrication of cross-coupled transistors at the bit line intersection can be conveniently achieved. To that end, the source 96 and drain 98 regions of a P-channel transistor 100 are formed in the face of an N-type substrate 102. The metal bit line section 82 includes an extension 104 which has formed thereto a contact 106 to the transistor source region 96 lying therebelow. A metal supply voltage rail or bus 108 also has formed thereto a contact 109 to the transistor drain region 98 lying therebelow. The source and drain regions 96 and 98 are heavily doped with a P+ semiconductor impurity. The polysilicon crossover member 94 of the other bit line BL forms the gate electrode for the transistor 100. Thus, transistor 100 is a P-channel transistor having its gate connected to bit line BL, its source connected to bit line BL and its drain connected to a supply voltage. Thus, when the voltage on bit line BL is pulled lower than that on bit line BL, the latter bit line will be pulled up to the supply voltage.

A second P-channel transistor 110 is formed in the substrate 102 in a manner comparable to that of transistor 100. However, the base of transistor 110 is connected to bit line BL through the polysilicon crossover member 80, and the source 112 thereof is connected to bit line BL. The drain region 98 of transistors 100 and 110 is common, and is connected to the supply rail 108. The transistor 110 operates in a manner similar to that of transistor 100, in that a voltage on bit line BL lower than that on bit line BL causes the P-channel transistor 110 to be driven into conduction. Bit line BL is thereby pulled up to the supply voltage. The fabrication of the transistor structure of FIG. 6, as well as the bit line structure, is accomplished using conventional integrated circuit fabrication techniques. However, other fabrication methods could be used to form the crossover and the associated underlying circuit.

Figure 7:
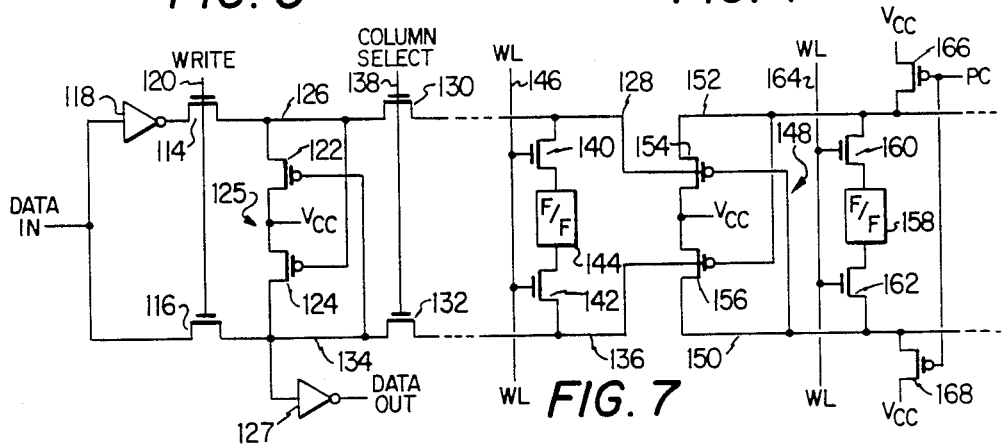
FIG. 7 is a circuit drawing of the crossed bit lines, incorporating cross-coupled pull-up transistors.

FIG. 7 illustrates in circuit diagram form the cross-coupled pull-up feature of the invention which is conveniently utilized in connection with the crossed bit line feature. In the circuit diagram of FIG. 7, a Data Input logic signal, and its complement, are applied to a pair of N-channel transistors 114 and 116. An inverter 118 provides the complement of a signal on the logic Data In to transistor 114. A Write signal on input 120 is applied to the gate terminals of the respective transistors 114 and 116. A pair of cross-coupled pull-up transistors 122 and 124, different from those described above, are connected between bit line segments 126 and 134. As will be described more fully below, transistors 122 and 124 form a part of a sense amplifier 125 for use with the noted complementary bit line. Connected in series with bit line segments 126 and 128 is an N-channel transistor 130. In like manner, N-channel transistor 132 is connected in series between bit line segments 134 and 136. A Column Select input 138 is connected to the respective gates of transistors 130 and 132 to effect a particular column selection of the exemplary memory. N-channel transistors 140 and 142 connect a memory cell 144 between the bit line segment 128 and 136.

A Word Line input 146 drives the respective gates of transistors 140 and 142 during a read or write operation to thereby retrieve or store data within the storage cell 144. Bit lines 128 and 136 form a crossover 148, the upper bit line section 128 being connected to the lower bit line section 150, and the other lower bit line section 136 being connected to the other upper bit line section 152. The crossed complementary bit lines are physically formed so as to be situated such that a voltage induced therein has components common to both bit lines of the pair. Bit line section 128 defines a part of the complementary bit pair which is parallel and adjacent bit line section 136. Bit line section 128 extends adjacent bit line section 136 only for a desired distance until the two lines cross at point 148. Bit line section 128 lies on one lateral side of section 136, and when crossed, the sections are laterally reversed and are extended another desired distance in a parallel adjacent relationship. While both bit line sections are shown rerouted to form the crossing point 148, it should be understood that one of the bit lines of the pair can be extended in a rectilinear path, and the other crossed back and forth thereover to provide the parallel and adjacent relationship.

A pair of cross-coupled pull-up P-channel transistors 154 and 156, as described above, are connected between bit line sections 150 and 152. Bit line sections 150 and 152 are extended to the right of the figure through the other half of the memory section. Memory storage element 158 is connected in the other memory section half to bit lines 152 and 150 by respective transistors 160 and 162. Word Line input 164 is connected to the gates of transistors 160 and 162 and is effective to cause data to be written into the selected memory cell 158.

As noted above, the P-channel pull-up transistors 154 and 156 operate in conjunction with the bit line crossover 148 to increase the noise immunity of the memory during read and write operations. The drain terminal of each transistor 154 and 156 is connected in common to a supply voltage Vcc, while the respective source terminals thereof are connected to the bit lines 152 and 150. Transistor 154 associated with bit line 152 has its gate terminal connected to bit line segment 150. The gate of transistor 156 is comparably connected to the other bit line segment 152. It should be noted that transistors 154 and 156 are P-channel transistors, thus rendering the transistors conductive when the respective gates are driven to a voltage less than which exists on the bit line connected to the respective source terminal. As a result, transistor 156 will be conductive and couple the supply voltage Vcc to the bit line segment 150 whenever a voltage appears on bit line segment 152 which is lower than that on line 150. In like manner, transistor 154 will become conductive and couple the supply voltage Vcc to bit line segment 152 whenever a voltage appears on bit line segment 150 which is less than that on line 152. The pull-up transistors 154 and 156 thus facilitate a reliable determination by the sense amplifier 125 of the logic state of the memory readout by holding one bit line pulled up to the supply voltage, while the memory cell pulls the other bit line toward a logic zero.

With the use of the cross-coupled pull-up transistors 154 and 156, the positive feedback generated between the bit lines 150 and 152 enhances the noise immunity of the memory during read and write operations. The storage element of the memory cell 158 generally includes a pair of cross-coupled transistors forming a flip-flop. Before executing a memory operation of a particular memory cell, the associated bit lines are precharged to a logic high by transistors 166 and 168. A signal is applied to the PC lines of precharge transistors 166 and 168 to momentarily turn on the transistors and connect the Vcc supply voltage to the bit lines 150 and 152. During a read operation, the Word Line 164 is clocked to thereby drive transistors 160 and 162 into conduction. Depending on whether a one or zero has been stored in the memory cell 158, a voltage somewhat less than Vcc will be coupled to one of the bit line segments 150 or 152. For example, in a memory having a five volt supply (Vcc), if the differential sense amplifier 125 initially detects about 5.00 volts on bit line segment 152 and a voltage less than that on bit line 150, it will be assumed, for example, that a zero was stored in the memory cell 158. The noted voltages would be reversed on bit line segments 150 and 152 if a one were previously stored in the memory cell 158.

In the example above, the differential amplifier begins providing a reliable output when the voltage difference between the bit line segments 150 and 152 is on the order of a FET transistor threshold voltage. As noted, the cross-coupled pull-up transistors 154 and 156 are provided to assist in providing reliable sense amplifier operation with regard to distinguishing memory cell readout voltages corresponding to a one or zero bit. For example, if bit line 152 were one transistor threshold voltage less than Vcc, e.g., 4.00 volts, transistor 156 would be driven into conduction and assure that bit line segment 150 were pulled up to five volts. In a comparable manner, if bit line segment 150 were driven to a threshold voltage less than Vcc by the cell readout, transistor 154 would conduct and pull the other bit line 152 up to Vcc. This feature enhances the differential readout voltage of the memory cell 134 by assuring that any electrical noise, which appears on the bit line which is not driven low by a cell readout, is extinguished by the active pull up to the supply voltage.

A similar cross-coupled pull-up arrangement is provided by P-channel transistors 122 and 124 connected across bit line segments 126 and 134. As with transistors 154 and 156, the transistors 122 and 124 are cross-coupled to pull one bit line segment to a Vcc voltage when the other bit line segment is driven somewhat less positive. This is the situation when one of the memory cells on the bit line are selected and read. A sense amplifier function is thus also realized. Other sense amplifiers which are more sensitive, or which are of the differential type may be used with the invention.

The active pull up of the bit line sections 126 and 134 is important, as these sections are isolated from the pull up of bit line sections 150 and 152 when the column select transistors 130 and 132 are turned off. Therefore, without the pull up provided by transistors 122 and 124, a certain amount of noise immunity would be lost between the bit line sections 126, 134 and 128, 136. The cross-coupled pull-up provided by P-channel transistors 122 and 124 also provide a full logic low or logic high voltage to the Data Output through inverter 127. Inverter 127, together with transistors 122 and 124 provide the sense amplifier function capable of driving other circuits with full logic levels.

In accordance with another feature of the invention, the column select transistors 130 and 132 are constructed as N-channel devices to thereby improve the readout reliability of the signal voltages on bit lines 128 and 136. Transistors 130 and 132, being formed as N-channel devices, will not transfer small signal voltage changes from the bit line segment 128 to 136 when such voltages are within a transistor threshold voltage of the level on the column select line 138. For example, if the threshold voltage of transistor 122 were about one volt, and a clock signal of about five volts were applied to the column select line 138, transistor 130 would not conduct until the voltage on bit line 128 reached about four volts. In the example, there is thus about a one volt margin by which noise may appear on the bit line 128 without transistor 130 conducting.

When transistors 114 and 116 are turned off, and the Word Line 146 and Column Select line 138 are clocked, the contents of the memory cell 144 will be read out and placed on the complementary bit lines 128 and 136. The readout voltages on the bit lines will be restored to the appropriate logic high and low levels by the cross-coupled pull-up transistors 122 and 124. As noted above, transistors 122 and 124 thus operate as a sense amplifier for generating a full digital signal from the memory cell readout signals. The output of the inverter 127 provides the driving capability to the Data Output for driving other circuitry.

As also noted above, a data bit is written into the desired cell of the complementary bit line by presenting the data bit and its complement to the respective N-channel transistors 114 and 116. While N-channel transistors are inherently excellent switching transistors, such devices are not well adapted to provide a fast drain recovery at the extreme upper limit of the supply voltage. P-channel devices do, however, provide an excellent high speed recovery to the supply voltage rail and thus complement the shortcomings of the N-channel devices. Hence, the P-channel transistors 122 and 124, operating in conjunction with the N-channel transistors 114 and 116, provide beneficial combination for high speed switching and full pull-up to the supply voltage. Accordingly, during a write operation it is assured that one of the bit lines 126 or 134 will be quickly forced to the supply voltage Vcc by one of the P-channel transistors 122 or 124. The foregoing also holds true for the N-channel transistors 130 and 132 operating in conjunction with P-channel pull-up transistors 154 and 156.

From the foregoing, a complementary bit line structure has been disclosed which includes features that provide a technical advantage over other memory structures heretofore known. For example, disclosed is a crossed bit line structure which reduces the memory circuits susceptibility to interference from undesired electrical signals. A cross-coupled pull-up circuit is also disclosed which operates in conjunction with the crossed bit lines for providing positive feedback so that the differential signals on the bit line are maintained distinct. Improved sense amplifier operation can thereby be achieved. Also disclosed is the use of N-channel column select transistors placed serially in each bit line of the complementary pair for providing an improved noise margin of the memory circuit. A cross-coupled pull-up circuit comprising P-channel transistors is also employed to provide full logic level signals to the memory cells during a write operation, or to the data output inverter during read operations.

While the invention has been disclosed above in connection with an MOS-type of memory, the principles and concepts of the invention are applicable with equal advantage to bipolar types of complementary bit line memories. For example, the N-channel and P-channel devices described above could be interchanged if the bit lines were also initially pulled to a low, instead of precharged to a high. It is to be understood that many other changes in detail may be made as a matter of engineering choices without departing from the scope of the invention as defined by the appended claims.

What is claimed is:

1. A semiconductor memory, comprising:
   an array of memory cells arranged in rows and columns;
   first and second bit lines extending in a direction parallel to one another, and associated with a first column of memory cells in said array for communicating data from a selected memory cell in said first column by way of a differential signal between said first and second bit lines;
   third and fourth bit lines extending in said direction parallel to one another, and associated with a second column of memory cells in said array adjacent said first column for communicating data from a selected memory cell in said second column by way of a differential signal between said third and fourth bit lines;
   wherein said first and second bit lines cross one another a plurality of times along said direction so that said first and second bit lines are each adjacent to said third bit line for a distance along said direction;
   wherein said third and fourth bit lines also cross one another so that said first and second bit lines are also adjacent to said fourth bit line for substantially equal distances;
   and wherein the number of times said third and fourth bit lines cross one another is an integral multiple of two times the number of times said first and second bit lines cross one another.

2. The semiconductor memory of claim 1, wherein, at a location that said first and second bit lines cross one another, said first bit line makes contact to a polycrystalline silicon layer underlying said second bit line.

3. The semiconductor memory of claim 2, wherein said second bit line also makes contact to a polycrystalline silicon layer underlying said first bit line at a location that said first and second bit lines cross one another.

4. The semiconductor memory of claim 1, wherein a location at which said third and fourth bit lines cross one another is aligned with a location at which said first and second bit lines cross one another.

5. A semiconductor memory, comprising:
   an array of memory cells arranged in rows and columns;
   first and second bit lines extending in a direction parallel to one another, and associated with a first column of memory cells in said array for communicating data from a selected memory cell in said first column by way of a differential signal between said first and second bit lines;
   third and fourth bit lines extending in said direction parallel to one another, and associated with a second column of memory cells in said array adjacent said first column for communicating data from a selected memory cell in said second column by way of a differential signal between said third and fourth bit lines;
   a first pull-up, having an output connected to said first bit line, and having an input connected to said second bit line, said first pull-up for presenting a first voltage at its output responsive to the voltage at its input exceeding a predetermined voltage limit; and a second pull-up, having an output connected to said second bit line, and having an input connected to said first bit line, said second pull-up for presenting said first voltage at its output responsive to the voltage at its input exceeding said predetermined voltage limit;

wherein said first and second bit lines cross one another along said direction so that said first and second bit lines are each adjacent to said third bit line for a distance along said direction.

6. The semiconductor memory of claim 5, wherein said first and second pull-ups are each located at a location where said first and second bit lines cross one another.

7. The semiconductor memory of claim 5, wherein said first pull-up comprises a transistor having a conductive path connected between said first bit line and said first voltage, and having a control electrode connected to said second bit line;

and wherein said second pull-up comprises a transistor having a conductive path connected between said second bit line and said first voltage, and having a control electrode connected to said first bit line.

8. A semiconductor memory, comprising:

an array of memory cells arranged in rows and columns;

first and second bit lines extending in a direction parallel to one another, and associated with a first column of memory cells in said array for communicating data from a selected memory cell in said first column by way of a differential signal between said first and second bit lines;

third and fourth bit lines extending in said direction parallel to one another, and associated with a second column of memory cells in said array adjacent said first column for communicating data from a selected memory cell in said second column by way of a differential signal between said third and fourth bit lines;

wherein said first and second bit lines cross one another a plurality of times along said direction so that said first and second bit lines are each adjacent to said third bit line for a distance along said direction;

a first bit line load connected to said first bit line and located at a location where said first and second bit lines cross one another; and a second bit line load connected to said second bit line and located at a location where said first and second bit lines cross one another.

9. A semiconductor memory, comprising:

an array of memory cells arranged in rows and columns;

a first pair of parallel bit lines extending in a direction and associated with a first column of memory cells in said array, for communicating data from a selected memory cell in said first column by way of a differential signal between said first pair of bit lines;

a second pair of parallel bit lines extending in said direction and associated with a second column of memory cells in said array, said second pair of bit lines adjacent said first pair of bit lines, for communicating data from a selected memory cell in said second column by way of a differential signal between said second pair of bit lines;

a first bit line pull-up associated with each of said first and second pair of bit lines, each first pull-up having an output connected to a first bit line of its associated pair, and having an input connected to a second bit line of its associated pair, said first pull-up for presenting a first voltage at its output responsive to the voltage at its input exceeding a predetermined voltage limit; and a second bit line pull-up associated with each of said first and second pair of bit lines, each second pull-up having an output connected to a second bit line of its associated pair, and having an input connected to said first bit line of its associated pair, said second pull-up for presenting said first voltage at its output responsive to the voltage at its input exceeding said predetermined voltage limit;

wherein said first pair of parallel bit lines cross one another at a first predetermined location along said direction;

and wherein said second pair of bit lines do not cross one another at said first predetermined location along said direction.

10. The semiconductor memory of claim 9, wherein said first and second pull-ups are each located at a location where the first and second bit lines of its associated pair cross one another.

11. The semiconductor memory of claim 9, wherein said first pull-ups each comprise a transistor having a conductive path connected between said first bit line and said first voltage, and having a control electrode connected to said second bit line;

and wherein said second pull-ups each comprise a transistor having a conductive path connected between said second bit line and said first voltage, and having a control electrode connected to said first bit line.

12. A semiconductor memory, comprising:

an array of memory cells arranged in rows and columns;

first and second bit lines extending in a direction parallel to one another, and associated with a column of memory cells in said array for communicating data from a selected memory cell in said column by way of a differential signal between said first and second bit lines, said first and second bit lines crossing one another;

a conductor extending the length of said column of memory cells so as to be adjacent either said first or said second bit line;

wherein said first and second bit lines are each adjacent said conductor for a distance;

a first bit line load connected to said first bit line and located at a location where said first and second bit lines cross one another; and a second bit line load connected to said second bit line and located where said first and second bit lines cross one another.

* * * * *